United States Patent
Nojiri et al.

(10) Patent No.: US 11,059,966 B2
(45) Date of Patent: Jul. 13, 2021

(54) LIQUID EPOXY RESIN COMPOSITION FOR SEALING, AND ELECTRONIC COMPONENT DEVICE

(71) Applicant: HITACHI CHEMICAL COMPANY, LTD., Tokyo (JP)

(72) Inventors: Naoyuki Nojiri, Tokyo (JP); Hisato Takahashi, Tokyo (JP); Makoto Kunimi, Tokyo (JP); Kohji Hori, Tokyo (JP)

(73) Assignee: SHOWA DENKO MATERIALS CO., LTD., Tokyo (JP)

( * ) Notice: Subject to any disclaimer, the term of this patent is extended or adjusted under 35 U.S.C. 154(b) by 0 days.

(21) Appl. No.: 16/096,333

(22) PCT Filed: Apr. 25, 2017

(86) PCT No.: PCT/JP2017/016444
§ 371 (c)(1),
(2) Date: Oct. 25, 2018

(87) PCT Pub. No.: WO2017/188286
PCT Pub. Date: Nov. 2, 2017

(65) Prior Publication Data
US 2019/0127571 A1    May 2, 2019

(30) Foreign Application Priority Data
Apr. 28, 2016 (JP) .............................. JP2016-091947

(51) Int. Cl.
| | | |
|---|---|---|
| *C08L 63/00* | (2006.01) | |
| *C08K 5/5415* | (2006.01) | |
| *C08L 83/04* | (2006.01) | |
| *C08G 77/04* | (2006.01) | |
| *H01L 23/29* | (2006.01) | |
| *H01L 23/31* | (2006.01) | |
| *C08G 59/42* | (2006.01) | |
| *C08G 59/40* | (2006.01) | |
| *C08L 33/06* | (2006.01) | |
| *C08L 33/12* | (2006.01) | |

(52) U.S. Cl.
CPC .......... *C08L 63/00* (2013.01); *C08G 59/4085* (2013.01); *C08G 59/4253* (2013.01); *C08G 77/04* (2013.01); *C08K 5/5415* (2013.01); *C08L 33/068* (2013.01); *C08L 33/12* (2013.01); *C08L 83/04* (2013.01); *H01L 23/29* (2013.01); *H01L 23/293* (2013.01); *H01L 23/295* (2013.01); *H01L 23/296* (2013.01); *H01L 23/31* (2013.01); *C08L 2203/206* (2013.01); *C08L 2205/03* (2013.01); *C08L 2205/22* (2013.01); *C08L 2207/53* (2013.01)

(58) Field of Classification Search
CPC ..... C08K 5/5415; C08L 33/068; C08L 33/12; C08L 83/04; C08L 63/00; C08L 2203/206; C08L 2205/03; C08L 2205/22; C08L 2207/53; H01L 23/296; H01L 23/295; H01L 23/31; H01L 23/293; H01L 23/29; C08G 77/04; C08G 59/4253; C08G 59/4086
USPC .......................................... 525/531
See application file for complete search history.

(56) References Cited

U.S. PATENT DOCUMENTS 6,147,142 A * 11/2000 Geek .................... C09D 201/00
                                              523/201
2007/0251419 A1   11/2007   Yamaguchi et al.
2016/0251510 A1   9/2016   Furukawa et al.

FOREIGN PATENT DOCUMENTS

| | | |
|---|---|---|
| JP | 2007-146150 A | 6/2007 |
| TW | 201529699 A | 8/2015 |
| WO | 2006/019041 A1 | 2/2006 |
| WO | 2015/053289 A1 | 4/2015 |

* cited by examiner

*Primary Examiner* — David T Karst
(74) *Attorney, Agent, or Firm* — Fitch, Even, Tabin & Flannery, L.L.P.

(57) ABSTRACT

A liquid epoxy resin composition for sealing includes an epoxy resin, a curing agent, and a particle having a core-shell structure. In the composition, the particle having a core-shell structure includes a core including a cross-linked polysiloxane and a shell including a polymer in which the content of a structural unit having an epoxy group is 10% by mass or more.

15 Claims, No Drawings

LIQUID EPOXY RESIN COMPOSITION FOR SEALING, AND ELECTRONIC COMPONENT DEVICE

CROSS-REFERENCE TO RELATED APPLICATIONS

This application is a U.S. national phase application filed under 35 U.S.C. § 371 of International Application No. PCT/JP2017/016444, filed Apr. 25, 2017, which claims priority from Japanese Patent Application No. 2016-091947, filed Apr. 28, 2016, designating the United States, which are hereby incorporated herein by reference in their entirety.

TECHNICAL FIELD

The present invention relates to a liquid epoxy resin composition for sealing, and an electronic component device.

BACKGROUND ART

Conventionally, in the field of sealing of the elements of electronic component devices such as transistors or ICs (Integrated Circuits), sealing with resins has been mainstream in view of productivity, costs, and the like, and various resin compositions have been applied. Among them, epoxy resins have often been used. This is because epoxy resins have an excellent balance of various characteristics such as workability, moldability, electrical characteristics, moisture resistance, heat resistance, mechanical characteristics, and adhesiveness to insert products. In particular, liquid epoxy resin compositions for sealing have been widely used as sealing materials in semiconductor devices mounted on bare chips, such as COB (Chip on Board), COG (Chip on Glass), or TCP (Tape Carrier Package). In semiconductor devices (flip chips) formed by directly bump-connecting semiconductor elements onto wiring substrates in which ceramic, glass/epoxy resins, glass/imide resins, polyimide films or the like are used as substrates thereof, liquid epoxy resin compositions for sealing have been used as materials filled into clearances (gaps) between the bump-connected semiconductor elements and wiring substrates. Liquid epoxy resin compositions for sealing have played important roles for protecting electronic components from the influences of temperature and humidity, mechanical external force, and the like.

Flexibilizers and the like may be added into liquid epoxy resin compositions for sealing in order to impart such functions as described above to the compositions. For example, as a flexibilizer, the technique of using particles having core-shell structures has been known. As the particles having core-shell structures, core-shell-type silicone compounds containing silicone compounds have been known (see, for example, Patent Document 1).

CITATION LIST

Patent Document

SUMMARY OF INVENTION

Technical Problem

Use of core-shell-type silicone compounds as flexibilizers has had the effect of decreasing the elastic moduli of the cured products of liquid epoxy resin compositions for sealing, thereby decreasing stress generated in the packages of electronic components. However, the thicknesses of recent packages have been increasingly reduced, and the conventional core-shell-type silicone compounds have been incapable of sufficiently satisfying requirements with respect to fracture toughness and adhesiveness to adherends such as semiconductor substrates. From the viewpoint of productivity, being able to maintain favorable pot lives for liquid epoxy resin compositions for sealing has been required.

Under such circumstances, the invention aims to provide a liquid epoxy resin composition for sealing having a superior pot life as well as having superior fracture toughness and superior adhesiveness after having been cured, and to provide an electronic component device formed by using the composition.

Solution to Problem

Means of solving the problems includes the following embodiments. However, the invention is not restricted to the embodiments.

<1> A liquid epoxy resin composition for sealing, the composition including:
an epoxy resin;
a curing agent; and
a particle having a core-shell structure,
wherein the particle having a core-shell structure includes: a core including a cross-linked polysiloxane; and a shell including a polymer in which a content of a structural unit having an epoxy group is 10% by mass or more.

<2> The liquid epoxy resin composition for sealing according to <1>, wherein the polymer is a polymer obtained by vinyl polymerization.

<3> The liquid epoxy resin composition for sealing according to <1> or <2>, wherein the polymer is a copolymer of methyl methacrylate and glycidyl methacrylate.

<4> The liquid epoxy resin composition for sealing according to any one of <1> to <3>, wherein a content of the cross-linked polysiloxane is from 50% by mass to 70% by mass with respect to the total mass of the core and the shell of the particle having a core-shell structure.

<5> The liquid epoxy resin composition for sealing according to any one of <1> to <4>, further including a silane coupling agent.

<6> An electronic component device, including an element sealed with the liquid epoxy resin composition for sealing according to any one of <1> to <5>.

Advantageous Effects of Invention

According to the invention, a liquid epoxy resin composition for sealing having a superior pot life as well as having superior fracture toughness and superior adhesiveness after having been cured, and an electronic component device formed by using the composition are provided.

DESCRIPTION OF EMBODIMENTS

Embodiments of the invention will be described in detail below. However, the invention is not limited to the embodiments described below. In the embodiments described below, components (also including element steps and the like) in the embodiments are not essential unless otherwise specified or considered to be theoretically obviously essential. The same also applies to numerical values and the ranges of the numerical values, and the invention is not restricted by the numerical values and the ranges.

In the present disclosure, the term "step" encompasses a step of which the object is achieved even in a case in which the step is unable to be definitely distinguished from another step, as well as a step independent from another step.

In the present disclosure, a numerical range expressed by "x to y" includes the values of x and y in the range as the minimum and maximum values, respectively.

In a numerical range expressed in a stepwise manner in the present disclosure, the upper or lower limit value expressed in one numerical range may be replaced by the upper or lower limit value in another numerical range expressed in a stepwise manner. In a numerical range expressed in the present disclosure, the upper or lower limit value of the numerical range may be replaced by values described in Examples.

In the present disclosure, each component may include plural kinds of substances corresponding to the component. In a case in which plural kinds of substances corresponding to each component are present in a composition, the content by percentage or amount of each component means the total content by percentage or amount of the plural kinds of the substances present in the composition unless otherwise specified.

In the present disclosure, plural kinds of particles corresponding to each component may be included. In a case in which plural kinds of particles corresponding to each component are present in a composition, the particle diameter of each component means the value of a mixture of the plural kinds of the particles present in the composition unless otherwise specified.

In the case of viewing a region in which a layer or a film is present, the term "layer" or "film" encompasses a case in which the layer or the film is formed in the entire region, as well as a case in which the layer or the film is formed only in part of the region.

In the present disclosure, "liquid at ordinary temperature" means the state of being liquid at 25° C. In the present disclosure, "liquid" means a substance that exhibits flowability and a viscosity property, and that has a viscosity, which is a measure indicating the viscosity property, of from 0.0001 Pa·s to 100 Pa·s at 25° C.

In the present disclosure, a viscosity is defined as a value obtained by multiplying a measurement value in the case of rotating an EHD type rotation viscometer at a predetermined revolution per minute (rpm) for one minute at 25° C., by a predetermined conversion factor. In a liquid kept at 25±1° C., the measurement value can be obtained using the EHD type rotation viscometer equipped with a cone rotor having a cone angle of 3° and a cone radius of 14 mm. The revolution per minute and the conversion factor vary according to the viscosity of a liquid to be measured. Specifically, the viscosity of the liquid to be measured is roughly estimated in advance, and the revolution per minute and the conversion factor are determined according to the estimated value.

In the present disclosure, the revolution per minute is set to 1 time/min, and the conversion factor is set to 5.0 in a case in which the estimated value of the viscosity of a liquid to be measured is from 0 Pa·s to less than 1.25 Pa·s; the revolution per minute is set to 2.5 times/min, and the conversion factor is set to 2.0 in a case in which the estimated value of the viscosity is from 1.25 Pa·s to less than 2.5 Pa·s; the revolution per minute is set to 5 times/min, and the conversion factor is set to 1.0 in a case in which the estimated value of the viscosity is from 2.5 Pa·s to less than 6.25 Pa·s; the revolution per minute is set to 10 times/min, and the conversion factor is set to 0.5 in a case in which the estimated value of the viscosity is from 6.25 Pa·s to less than 12.5 Pa·s; and the revolution per minute is set to 20 times/min, and the conversion factor is set to 0.25 in a case in which the estimated value of the viscosity is from 6.25 Pa·s to less than 12.5 Pa·s.

Liquid Epoxy Resin Composition for Sealing

A liquid epoxy resin composition for sealing according to an embodiment of the invention includes: an epoxy resin; a curing agent; and a particle having a core-shell structure, and the particle having a core-shell structure includes: a core including a cross-linked polysiloxane; and a shell including a polymer in which the content of a structural unit having an epoxy group is 10% by mass or more.

In the present disclosure, "polymer in which content of structural unit having epoxy group is 10% by mass or more" means a polymer in which the proportion of a structural unit derived from a monomer having an epoxy group with respect to all of the structural units of the polymer is 10% by mass or more (i.e., a polymer in which the proportion of a monomer having an epoxy group with respect to the total mass of the monomers as raw materials is 10% by mass or more).

Since the liquid epoxy resin composition for sealing includes the particle including the shell containing the polymer in which the content of a structural unit having an epoxy group is 10% by mass or more, superior fracture toughness and a superior adhesive property after curing, as well as a superior pot life are provided. The reason why the composition provides superior fracture toughness and superior adhesive property after having been cured is not clear but it is presumed to be that the polymer included in the shell contains a certain amount or more of an epoxy group, thereby increasing the affinity of the interface between the epoxy resin and the shell. Also, it is presumed that a reaction with the epoxy resin is prevented from excessively occurring in comparison with a case in which the shell includes a hydroxyl group, a carboxyl group, or the like as a reactive functional group other than the epoxy group, thereby also favorably maintaining the pot life.

(A) Epoxy Resin

The liquid epoxy resin composition for sealing contains an epoxy resin. The epoxy resin is preferably an epoxy resin having two or more epoxy groups in one molecule. As the epoxy resin, an epoxy resin commonly used in a liquid epoxy resin composition for sealing can be used without particular restrictions.

The epoxy resin is preferably an epoxy resin that is liquid at ordinary temperature (hereinafter referred to as "liquid epoxy resin"). As the liquid epoxy resin, which is not particularly restricted, a liquid epoxy resin commonly used in a liquid epoxy resin composition for sealing can be used.

Examples of the liquid epoxy resin include: a diglycidyl ether type epoxy resin such as bisphenol A, bisphenol F, bisphenol AD, bisphenol S, or hydrogenated bisphenol A; an epoxy resin obtained by epoxidizing a novolac resin of a phenol and an aldehyde, such as an ortho cresol novolac type epoxy resin; a glycidyl ester type epoxy resin obtained by a reaction between epichlorohydrin and a polybasic acid such as phthalic acid or dimer acid; a glycidyl amine type epoxy resin obtained by a reaction between epichlorohydrin and an amine compound such as p-aminophenol, diaminodiphenyl methane, or isocyanuric acid; a linear aliphatic epoxy resin obtained by oxidizing an olefin bond with a peracid such as peracetic acid; and an alicyclic epoxy resin. Such liquid epoxy resins may be used singly, or in combination of two or more kinds thereof. Especially, liquid diglycidyl ether type epoxy resins are preferred, and liquid bisphenol type epoxy resins are further preferred, from the viewpoint of flowability. Liquid glycidyl amine type epoxy resins are preferred from the viewpoints of heat resistance, adhesiveness, and flowability.

In a case in which the epoxy resin described above is included in the liquid epoxy resin composition for sealing, the proportion of the epoxy resin is preferably 15% by mass or more, more preferably 20% by mass or more, and still more preferably 25% by mass or more, with respect to the total amount of epoxy resins, from the viewpoint of exhibiting the performance of the epoxy resin.

A solid epoxy resin can also be used together in the liquid epoxy resin composition for sealing as long as the effect of the invention is achieved. In such a case, the content of the solid epoxy resin is preferably set to 10% by mass or less with respect to the total amount of the epoxy resins from the viewpoint of flowability in molding.

The amount of hydrolyzable chlorine in the epoxy resin is preferably smaller from the viewpoint of suppressing the corrosion of aluminum wiring on an element such as an IC, and more preferably 500 ppm or less for obtaining the liquid epoxy resin composition for sealing having superior moisture resistance. Herein, the amount of hydrolyzable chlorine is a value determined by dissolving 1 g of a sample epoxy resin in 30 mL of dioxane, adding 5 mL of 1N-KOH methanol solution thereto, refluxing the resultant for 30 minutes, and then performing potentiometric titration of the resultant.

(B) Curing Agent

The curing agent included in the liquid epoxy resin composition for sealing is not particularly restricted. As the curing agent, a curing agent commonly used in a liquid epoxy resin composition for sealing can be used without particular restrictions. The curing agent is preferably a compound containing two or more functional groups each derived from a primary amine or a secondary amine in one molecule, from the viewpoint of the adhesiveness of the liquid epoxy resin composition for sealing to a substrate and the heat resistance of the composition. The curing agent is more preferably liquid at ordinary temperature without particular restrictions. Especially, the curing agent still more preferably includes an amine compound that is liquid at ordinary temperature and that has an aromatic ring (hereinafter also referred to as "liquid aromatic amine compound").

Examples of the liquid aromatic amine compound include diethyltoluenediamine(3,5-diethyltoluene-2,4-diamine and 3,5-diethyltoluene-2,6-diamine), 1-methyl-3,5-diethyl-2,4-diaminobenzene, 1-methyl-3,5-diethyl-2,6-diaminobenzene, 1,3,5-triethyl-2,6-diaminobenzene, 3,3'-diethyl-4,4'-diaminodiphenylmethane, and 3,5,3',5'-tetramethyl-4,4'-diaminodiphenylmethane. These may be used singly, or in combination of two or more kinds thereof.

The liquid aromatic amine compound may be a commercially available product. Examples of the commercially available product include EPICURE-W and EPICURE-Z (trade names, available from Yuka Shell Epoxy K.K.), KAYAHARD A-A, KAYAHARD A-B and KAYAHARD A-S (trade names, available from Nippon Kayaku Co., Ltd.), TOHTO AMINE HM-205 (trade name, available from Tohto Kasei Co., Ltd.), ADEKA HARDENER EH-101 (trade name, available from Asahi Denka Kogyo K. K.), EPOMIK Q-640 and EPOMIK Q-643 (trade names, available from Mitsui Chemicals, Inc.), and DETDA 80 (trade name, available from Lonza).

From the viewpoint of storage stability, the liquid aromatic amine compound is preferably at least one selected from the group consisting of 3,3'-diethyl-4,4'-diaminodiphenylmethane and diethyltoluenediamines, and the curing agent preferably includes either or a mixture thereof as a main component. As such a diethyltoluenediamine, 3,5-diethyltoluene-2,4-diamine and 3,5-diethyltoluene-2,6-diamine may be used singly, or in combination of two kinds thereof. In a case in which a combination of 3,5-diethyltoluene-2,4-diamine and 3,5-diethyltoluene-2,6-diamine is used, the proportion of 3,5-diethyltoluene-2,4-diamine is preferably set to 60% by mass or more.

An equivalent ratio between the epoxy resin and the curing agent in the liquid epoxy resin composition for sealing, i.e., a ratio of the number of active hydrogens in the curing agent to the number of epoxy groups in the epoxy resin (the number of active hydrogens in the curing agent/the number of epoxy groups in the epoxy resin) is not particularly restricted but is preferably set in a range of from 0.5 to 2, more preferably in a range of from 0.6 to 1.3, in order to reduce the amounts of respective unreacted components to low levels. The ratio described above is still more preferably set in a range of from 0.8 to 1.2 in order to obtain the epoxy resin composition for sealing, excellent in moldability and high reliability.

(C) Particle Having Core-Shell Structure

The particle having a core-shell structure used in the invention includes: a core including a cross-linked polysiloxane; and a shell including a polymer in which the content of a structural unit having an epoxy group is 10% by mass or more.

Core

The cross-linked polysiloxane included in the core is a silicone polymer that is formed of a diorganosiloxane having a [RR'SiO$_{2/2}$] unit as a main raw material and a cross-linking component, has a cross-linked structure, and is solid at ordinary temperature. As the cross-linking component, at least one selected from the group consisting of a trifunctional siloxane component having a trifunctional siloxane unit ([RSiO$_{3/2}$]) and a tetrafunctional siloxane component having a tetrafunctional siloxane unit ([SiO$_{4/2}$]) is preferably used.

In the [RSiO$_{3/2}$] unit and [RR'SiO$_{2/2}$] unit described above, each of R and R' independently represents a monovalent organic group, and is preferably an alkyl group having 6 or less carbon atoms or an aryl group. Examples of the alkyl group having 6 or less carbon atoms include a methyl group and an ethyl group, and examples of the aryl group include a phenyl group. A methyl group is preferred from the viewpoint of a cost and the low elastic modulus of the core.

From the viewpoint of suppressing a decrease in the elastic modulus of the epoxy resin composition for sealing and a decrease in the effect of reducing generated stress due to the excessively high hardness and excessively high elastic modulus of the cross-linked polysiloxane, the proportion of the cross-linking component in all of siloxane components included in the cross-linked polysiloxane is preferably from 0.5 mol % to 20 mol %, and more preferably from 2 mol % to 10 mol %, and the proportion of the trifunctional siloxane component as the cross-linking component is still more preferably from 2 mol % to 10 mol %.

From the viewpoint of suppressing the deterioration of, e.g., the marking property of a molded article, caused by increasing the amount of unreacted siloxane component due to a low crosslinking density, the proportion of the cross-linking component in all the siloxane components is preferably 0.5 mol % or more, and more preferably 2 mol % or more. The hardness of the core of the particle having a core-shell structure is important for decreasing stress generated to a semiconductor element, allowing thermal shock resistance to be favorable, also allowing the state of a surface of a molded article to be favorable, and forming the epoxy resin composition for sealing having excellent reliability. The hardness of the core can be controlled to a desired value by regulating the amount of cross-linked component used.

At least a part of the siloxane components included in the cross-linked polysiloxane preferably has a substituent having an ethylenic carbon-carbon double bond at a terminal thereof. As a result, since, for example, the ethylenic carbon-carbon double bond included in the core and the organic polymer included in the shell are grafted when the cross-linked polysiloxane which will become the core is polymerized and the shell is then formed by vinyl polymerization, the core and the shell can be firmly bound to each other by an organic bond. Examples of the substituent having an ethylenic carbon-carbon double bond include a vinyl group, an allyl group, a methacryloyl group, a methacryloxy group, and alkyl groups having these substituents at terminals thereof.

In a case in which at least a part of the siloxane components included in the cross-linked polysiloxane has the substituent having an ethylenic carbon-carbon double bond at a terminal thereof, the proportion of the siloxane components having the substituent having an ethylenic carbon-carbon double bond at a terminal thereof is preferably in a range of from 1 mol % to 10 mol % in all of the siloxane components. The effect of the grafting tends to be able to be sufficiently obtained in a case in which the proportion is 1 mol % or more, while the deterioration of physical properties such as the heat resistance and elastic modulus of the core due to the influence of the grafting tends to be suppressed in a case in which the proportion is 10 mol % or less.

The proportion of the cross-linked polysiloxane included in the core is preferably from 50% by mass to 70% by mass with respect to the total mass of the core and the shell from the viewpoint of flowability and the effect of reducing an elastic modulus.

Shell

The shell includes a polymer in which the content of a structural unit having an epoxy group is 10% by mass or more (hereinafter also referred to as "specific polymer"). The content of the structural unit having an epoxy group in the specific polymer is preferably 20% by mass or more, more preferably 25% by mass or more, and still more preferably 30% by mass or more. From the viewpoint of flowability and the effect of reducing an elastic modulus, the content of the structural unit having an epoxy group in the specific polymer is preferably 50% by mass or less, more preferably 40% by mass or less, and still more preferably 35% by mass or less.

The shell may be consisted of the specific polymer, or may include the specific polymer and a polymer other than the specific polymer. In a case in which the shell includes the specific polymer and the polymer other than the specific polymer, the content of the specific polymer is preferably 80% by mass or more, more preferably 90% by mass or more, and still more preferably 95% by mass or more, with respect to the total mass of the shell.

From the viewpoint of reactivity with an epoxy resin, the specific polymer is preferably a polymer obtained by vinyl polymerization, and more preferably a copolymer of a monomer having an epoxy group and a monomer copolymerizable with the monomer having an epoxy group.

Examples of the monomer having an epoxy group include monomers having glycidyl groups, such as glycidyl methacrylate, glycidyl vinyl ether, 4-hydroxybutyl acrylate glycidyl ether, or alcohol glycidyl ether. Glycidyl methacrylate is preferred in view of being a methacrylate ester and being easily introduced into a polymer main chain. The monomer copolymerizable with the monomer having an epoxy group may be unsubstituted or may have a substituent, and the substituent may be a reactive functional group other than the epoxy group. The reactive functional group means a group capable of reacting or interacting with the epoxy resin and the curing agent included in the epoxy resin composition for sealing, and examples thereof include an amino group, a hydroxyl group, a carboxyl group, an amide group, an acid anhydride group, and a maleimide group. In a case in which a monomer having a reactive functional group other than an epoxy group is used as a copolymerization component for the specific polymer, the amount thereof is preferably set in a range in which the reaction between the reactive functional group and the epoxy resin does not impart an adverse effect on a pot life or the like. Examples of the monomer copolymerizable with the monomer having an epoxy group include acrylic acid, methacrylic acid, acrylic acid alkyl ester, methacrylic acid alkyl ester, acrylamide, methacrylamide, acrylonitrile, methacrylonitrile, styrene, itaconic acid, crotonic acid, maleic acid, maleic anhydride, and maleic acid imide.

From the viewpoint of the fracture toughness and hydrolysis resistance of the epoxy resin composition for sealing after curing of the composition, the specific polymer is preferably a copolymer of a monomer having an epoxy group and a monomer having no reactive functional group. Specifically, the specific polymer is preferably a copolymer formed using at least glycidyl methacrylate and methacrylic acid alkyl ester as copolymerization components, and, from the viewpoints of a price and reactivity, preferably a copolymer formed using at least glycidyl methacrylate and methyl methacrylate as copolymerization components. From the viewpoint of improving the heat resistance of the epoxy resin composition for sealing, it is preferable to use a monomer having an aromatic ring as a copolymerization component.

It is preferable that the ratio of the shell in the particle having a core-shell structure is such that the core is satisfactory homogeneously coated with the shell and that the ratio is lower. In this regard, the mass ratio between the core and the shell (core: shell) in the particle having a core-shell structure is preferably in a range of from 1:1 to 5:1.

Method of Producing Particle Having Core-Shell Structure

Examples of a method of producing a particle having a core-shell structure include a method in which a cross-linked polysiloxane is synthesized by emulsion polymerization (first-step polymerization) to form a core, an initiator and a monomer which is a polymer component of a shell-forming polymer are then added thereto, and second-step polymerization of the resultant is performed to form a shell on the surface of the core. Preferably, a siloxane compound having an ethylenic carbon-carbon double bond is moderately blended into a siloxane monomer or an oligomer component used in the first-step polymerization. As a result, the polymer forming the core via the double bond is grafted to strengthen the interface between the core and the shell. The strength of a molded article of the epoxy resin composition for sealing can be enhanced by using the particle having a core-shell structure, obtained in such a manner.

The particle having a core-shell structure may be produced in a part or all of an epoxy resin. Examples of a method of producing the particle having a core-shell structure in a part or all of an epoxy resin include a method in which the synthesis of a core and the formation of a shell are performed in a mixture of an epoxy resin and a solvent, and the solvent is finally removed. This method enables particles having a core-shell structure to be favorably dispersed in the epoxy resin.

The particle diameter of the particle having a core-shell structure is not particularly restricted. A smaller particle having a core-shell structure is preferred for homogeneously modifying the liquid epoxy composition for sealing. For example, the average primary particle diameter of the particle is preferably in a range of from 0.05 μm to 1.0 μm, and more preferably in a range of from 0.05 μm to 0.5 μm. The average primary particle diameter of the particle having a core-shell structure can be measured by a laser scattering diffraction method. Specifically, the average primary particle diameter can be measured by using a measurement device (LS13 320) available from BECKMAN COULTER and loading a suspension into the device under conditions of a dispersion medium H2O-D and a refractive index of 1.43.

The content of the particle having a core-shell structure in the liquid epoxy resin composition for sealing is not particularly restricted. From the viewpoint of a temperature at which particles flow in the liquid epoxy resin compositions for sealing and a viscosity (pot life) at 110° C., the content is preferably from 0.1% by mass to 10% by mass, more preferably from 0.5% by mass to 7.5% by mass, and still more preferably from 1% by mass to 5% by mass, with respect to the total mass of the liquid epoxy resin composition for sealing.

(D) Curing Accelerator

A curing accelerator capable of promoting a reaction between the epoxy resin and the curing agent can be used in the liquid epoxy resin composition for sealing, if necessary. As the curing accelerator, which is not particularly restricted, a conventionally known curing accelerator can be used. Examples thereof include: cycloamidine compounds such as 1,8-diaza-bicyclo(5.4.0)undecene-7, 1,5-diaza-bicyclo(4.3.0)nonene-5, or 6-dibutylamino-1,8-diaza-bicyclo(5.4.0)undecene-7; tertiary amine compounds such as triethylenediamine, benzyldimethylamine, triethanolamine, dimethylaminoethanol, or tris(dimethylaminomethyl)phenol; imidazole compounds such as 2-methylimidazole, 2-ethyl-4-methylimidazole, 2-phenylimidazole, 2-phenyl-4-methylimidazole, 1-benzyl-2-phenylimidazole, 1-benzyl-2-methylimidazole, 2-phenyl-4,5-dihydroxymethylimidazole, 2-phenyl-4-methyl-5-hydroxymethylimidazole, 2,4-diamino-6-(2'-methylimidazolyl-(1))-ethyl-s-triazine, or 2-heptadecyl imidazole; organic phosphines such as trialkylphosphines such as tributylphosphine, dialkylarylphosphines such as dimethylphenylphosphine, alkyldiarylphosphines such as methyldiphenylphosphine, triphenylphosphine, or alkyl-substituted triphenylphosphine; compounds having intramolecular polarization obtained by adding compounds having π bonds such as maleic anhydride, quinone compounds such as 1,4-benzoquinone, 2,5-toluquinone, 1,4-naphthoquinone, 2,3-dimethylbenzoquinone, 2,6-dimethylbenzoquinone, 2,3-dimethoxy-5-methyl-1,4-benzoquinone, 2,3-dimethoxy-1,4-benzoquinone, or phenyl-1,4-benzoquinone, diazophenylmethane, or phenolic resins to the above-mentioned compounds; and derivatives of these compounds. Additional examples thereof include phenyl boron salts such as 2-ethyl-4-methylimidazoletetraphenylborate or N-methylmorpholinetetraphenylborate. Examples of latent curing accelerators include core-shell particles obtained by coating a compound that has an amino group and that is solid at ordinary temperature as a core with a shell which is an epoxy compound that is solid at ordinary temperature. As commercially available products of such core-shell particles, AJICURE (trade name, manufactured by Ajinomoto Co., Inc.), NOVACURE (trade name, manufactured by Asahi Kasei Chemicals Corp.) obtained by dispersing a microcapsulized amine in bisphenol A type epoxy resin, bisphenol F type epoxy resin, or the like, and the like can be used. These curing accelerators may be used singly, or in combination of two or more kinds thereof.

In a case in which the liquid epoxy resin composition for sealing includes the curing accelerator, the amount of the curing accelerator is not particularly restricted. For example, the amount is preferably from 0.1% by mass to 4.0% by mass, more preferably from 0.5% by mass to 2.0% by mass, and still more preferably from 0.8% by mass to 1.0% by mass, with respect to 100% by mass of the epoxy resin. When the amount is 0.1% by mass or more with respect to 100% by mass of the epoxy resin, satisfactory curability at low temperature is attained. When the amount is 4.0% by mass or less, the control of cure speed is easy, and storage stability such as a pot life or a shelf life is improved.

(E) Coupling Agent

In the liquid epoxy resin composition for sealing, a coupling agent can be used, if necessary, for the purpose of strengthening interfacial adhesion between the resin and an inorganic filler included if necessary or between the resin and a configuration member of an electronic component. As the coupling agent, which is not particularly restricted, a conventionally known coupling agent can be used. Examples thereof include: silane coupling agents such as a silane compound having at least one selected from the group consisting of a primary amino group, a secondary amino group, and a tertiary amino group, epoxysilane, mercaptosilane, alkyl silane, ureidosilane, or vinyl silane; titanate coupling agents; aluminum chelate coupling agents; and aluminum/zirconium coupling agents. Examples thereof include: silane coupling agents such as vinyltrichlorosilane, vinyltriethoxysilane, vinyltris(β-methoxyethoxy)silane, γ-methacryloxypropyltrimethoxysilane, β-(3,4-epoxycyclohexyl)ethyltrimethoxysilane, γ-glycidoxypropyltrimethoxysilane, γ-glycidoxypropylmethyldimethoxysilane, vinyltriacetoxysilane, γ-mercaptopropyltrimethoxysilane, γ-aminopropyltrimethoxysilane, γ-aminopropylmethyldimethoxysilane, γ-aminopropyltriethoxysilane, γ-aminopropylmethyldiethoxysilane, γ-anilinopropyltrimethoxysilane, γ-anilinopropyltriethoxysilane, γ-(N,N-dimethyl)aminopropyltrimethoxysilane, γ-(N,N-diethyl)aminopropyltrimethoxysilane, γ-(N,N-dibutyl)aminopropyltrimethoxysilane, γ-(N- methyl)anilinopropyltrimethoxysilane, γ-(N-ethyl)anilinopropyltrimethoxysilane, γ-(N,N-dimethyl)aminopropyltriethoxysilane, γ-(N,N-diethyl)aminopropyltriethoxysilane, γ-(N,N-dibutyl)aminopropyltriethoxysilane, γ-(N-methyl)anilinopropyltriethoxysilane, γ-(N-ethyl)anilinopropyltriethoxysilane, γ-(N,N-dimethyl)aminopropylmethyldimethoxysilane, γ-(N,N-diethyl)aminopropylmethyldimethoxysilane, γ-(N,N-dibutyl)aminopropylmethyldimethoxysilane, γ-(N-methyl)anilinopropylmethyldimethoxysilane, γ-(N-ethyl)anilinopropylmethyldimethoxysilane, N-(trimethoxysilylpropyl)ethylenediamine, N-(dimethoxymethylsilylisopropyl)ethylenediamine, methyltrimethoxysilane, dimethyldimethoxysilane, methyltriethoxysilane, γ-chloropropyltrimethoxysilane, hexamethyldisilane, vinyltrimethoxysilane, or γ-mercaptopropylmethyldimethoxysilane; and titanate coupling agents such as isopropyltriisostearoyltitanate, isopropyltris(dioctylpyrophosphate) titanate, isopropyltri(N-aminoethyl-aminoethyl) titanate, tetraoctylbis(ditridecylphosphite) titanate, tetra(2,2-diallyloxymethyl-1-butyl)bis(ditridecyl)phosphite titanate, bis(dioctylpyrophosphate)oxyacetate titanate, bis(dioctylpyrophosphate)ethylenetitanate, isopropyltrioctanoyltitanate, isopropyldimethacrylisostearoyltitanate, isopropyltridodecylbenzenesulfonyltitanate, isopropylisostearoyldiacryltitanate, isopropyltri(dioctylphosphate)titanate, isopropyltricumylphenyltitanate, or tetraisopropylbis(dioctylphosphite)titanate. These coupling agents may be used singly, or in combination of two or more kinds thereof.

In a case in which the liquid epoxy resin composition for sealing includes the coupling agent, the amount of the coupling agent is not particularly restricted. For example, the amount is preferably from 0.01% by mass to 2.0% by mass, and more preferably from 0.1% by mass to 1.6% by mass, with respect to 100% by mass of the inorganic filler which may be included if necessary. The effect of the invention is satisfactory exhibited in a case in which the amount of the blended coupling agent is 0.01% by mass or more with respect to 100% by mass of the inorganic filler, while moldability is improved in a case in which the amount thereof is 2.0% by mass or less with respect to 100% by mass of the inorganic filler.

(F) Inorganic Filler

The liquid epoxy resin composition for sealing may include an inorganic filler, if necessary. The inorganic filler is not particularly restricted. Examples thereof include: powders of inorganic substances such as silicas such as fused silica or crystalline silica, calcium carbonate, clay, aluminas such as oxidized alumina, silicon nitride, silicon carbide, boron nitride, calcium silicate, potassium titanate, aluminum nitride, beryllia, zirconia, zircon, forsterite, steatite, spinel, mullite, or titania; beads obtained by spheronization of the above-mentioned inorganic substances; and glass fibers. Examples of inorganic fillers having a flame-retardant effect include aluminum hydroxide, magnesium hydroxide, zinc borate, and zinc molybdate. These inorganic fillers may be used singly, or in combination of two or more kinds thereof. Especially, fused silica is preferred, and spherical fused silica is further preferred from the viewpoint of the flowability and permeability of the liquid epoxy resin composition for sealing into fine gaps.

The average particle diameter of the inorganic filler is not particularly restricted, and can be selected depending on, e.g., the kind of the inorganic filler. In a case in which spherical silica is used as the inorganic filler, the average particle diameter thereof is preferably within a range of from 0.3 μm to 10 μm and more preferably within a range of from 0.5 μm to 5 μm or less. In a case in which the average particle diameter is 0.3 μm or more, the inorganic filler tends to be favorably dispersed in the liquid epoxy resin composition for sealing, a thixotropic property is prevented from being excessively imparted to the liquid epoxy resin composition for sealing, and the deterioration of flow characteristics can be suppressed. In a case in which the average particle diameter is 10 μm or less, the inorganic filler is inhibited from settling out, the permeability and flowability of the liquid epoxy resin composition for sealing into fine gaps are inhibited from being deteriorated, and the generation of voids and the occurrence of non-filling are inhibited.

In a case in which the liquid epoxy resin composition for sealing includes the inorganic filler, the content the inorganic filler is preferably from 20% by mass to 90% by mass, more preferably from 25% by mass to 80% by mass, and still more preferably from 30% by mass to 60% by mass, with respect to the entire liquid epoxy resin composition for sealing. The effect of reducing a thermal expansion coefficient is high when the content of the inorganic filler is 20% by mass or more. The viscosity of the liquid epoxy resin composition for sealing tends to be easily controlled, whereby flowability, permeability, and dispensing properties are improved, when the content of the inorganic filler is 90% by mass or less.

(G) Ion Trap Agent

The liquid epoxy resin composition for sealing may include, if necessary, an ion trap agent from the viewpoint of improving the migration resistance, moisture resistance, and high-temperature exposure characteristics of a semiconductor element such as an IC. Examples of the ion trap agent include an ion trap agent represented by the following Formula (I) and an ion trap agent represented by the following Formula (II).

$$Mg_{1-x}Al_x(OH)_2(CO_3)_{x/2} \cdot mH_2O \quad (I)$$

In Formula (I), 0<X≤0.5, and m represents a positive number.

$$BiO_x(OH)_y(NO_3)_z \quad (II)$$

In Formula (II), 0.9≤x≤1.1, 0.6≤y≤0.8, and 0.2≤z≤0.4.

In a case in which the liquid epoxy resin composition for sealing includes the ion trap agent, the content of the ion trap agent is preferably from 0.1% by mass to 3.0% by mass, and more preferably from 0.3% by mass to 1.5% by mass, with respect to the entire liquid epoxy resin composition for sealing. In a case in which the ion trap agent is granulous, the average particle diameter thereof is preferably from 0.1 μm to 3.0 μm, and the maximum particle diameter thereof is preferably 10 μm or less.

The compound of Formula (I) is available as, for example, a commercially available product having a trade name "DHT-4A", manufactured by Kyowa Chemical Industry Co., Ltd. The compound of Formula (II) is available as, for example, a commercially available product having a trade name "IXE500", manufactured by Toagosei Co., Ltd. Another anion exchanger can also be added as an ion trap agent, if necessary. As the anion exchanger, which is not particularly restricted, a conventionally known anion exchanger can be used. Examples thereof include a hydrous oxide of an element selected from magnesium, aluminum, titanium, zirconium, antimony, or the like. Such hydrous oxides may be used singly, or in combination of two or more kinds thereof.

(H) Other Additive

The liquid epoxy resin composition for sealing may include another additive, if necessary. Examples of the other additive include coloring agents such as dyes or carbon black, diluents, leveling agents, and antifoaming agents, which can be used depending on the purpose.

Method of Producing Liquid Epoxy Resin Composition for Sealing

A method of producing a liquid epoxy resin composition for sealing is not particularly restricted as long as the respective components described above are satisfactory and homogeneously dispersed and mixed. Examples of such methods which are common include a method in which a liquid epoxy resin composition for sealing is produced by weighing predetermined blending amounts of components, mixing and kneading the components by using a grinding machine, a mixing roll, a planetary mixer, or the like, and, if necessary, defoaming the resultant.

Viscosity of Liquid Epoxy Resin Composition for Sealing

The viscosity of the liquid epoxy resin composition for sealing is not particularly restricted, and can be selected depending on an application thereof or the like. For example, the viscosity measured at 25° C. using an EHD type rotation viscometer is preferably 1,000 Pa·s or less. In a case in which the viscosity is 1,000 Pa·s or less, flowability and permeability available for the downsizing of an electronic component, the finer pitch of the connection terminal of a semiconductor element, and the finer wiring of a wiring substrate in recent years can be secured. The viscosity is more preferably 800 Pa·s or less, and still more preferably 500 Pa·s or less. The lower limit of the viscosity of the liquid epoxy resin composition for sealing is not particularly restricted. For example, the lower limit is preferably 0.1 Pa·s or more, and more preferably 1 Pa·s or more, from the viewpoint of mounting properties.

The viscosity of the liquid epoxy resin composition for sealing can be adjusted, if appropriate, by selecting, e.g., the kind and content of each component included in the liquid epoxy resin composition for sealing depending on the kinds of an electronic component and an electronic component device as targets for sealing and adhesion.

Electronic Component Device

An electronic component device according to the embodiment of the invention includes an element sealed using the liquid epoxy resin composition for sealing described above. The kind of the element is not particularly restricted. Examples of the element include semiconductor chips, transistors, diodes, capacitors, resistors, resistor arrays, coils, and switches.

EXAMPLES

The invention will be described with reference to Examples. However, the scope of the invention is not limited to these Examples. Tests on the various characteristics and reliability of liquid epoxy resin compositions for sealing produced in Examples and Comparative Examples were conducted by methods described below.

Fracture Toughness Test

A liquid epoxy resin composition for sealing was cast into a die of 12.75 mm×60 mm×4 mm, and heated at 175° C. for 1 hour to cure the liquid epoxy resin composition for sealing. Then, fracture toughness (unit: $MPam^{0.5}$) was measured using a MICRO-FORCE (THE 5900 series, available from INSTRON) under conditions of a test span of 50 mm, a test speed of 0.5 mm/min, and a load cell of 500 N.

Adhesion Test

A copper substrate and a silicon substrate were prepared as substrates to which the liquid epoxy resin composition for sealing would be adhered, and the liquid epoxy resin composition for sealing was molded in a cylindrical shape having a diameter of 3 mm and a height of 1 mm on a surface of each substrate. Then, shearing stress was applied to the molded article by using a BONDTESTER DS100 type (available from DAGE) under conditions of a head speed of 50 μm/sec and 25° C., and strength (unit: $Kgf/7~mm^2$) at which the molded article was peeled from each of the substrates was measured as adhesive strength which was an initial value.

With regard to adhesive strength after moisture absorption, a molded article produced in a manner similar to the manner described above was put in a HAST CHAMBER (trade name "EHS-211MD") available from ESPEC CORP. and humidified for 50 hours under conditions of 135° C. and 85% RH, shear stress was applied thereto under the same conditions as the conditions in the case of the adhesive strength which was the initial value, and strength (unit: $Kgf/7~mm^2$) at which the molded article was peeled from each of the substrates was measured as the strength after the moisture absorption.

Pot Life Test

The viscosity (unit: Pa·s) of the liquid epoxy resin composition for sealing at 110° C. was measured using a rheometer (trade name "AR2000", available from TA instruments). The liquid epoxy resin composition for sealing was left standing for 8 hours in a constant-temperature bath at 50° C., and the viscosity thereof at 110° C. was subsequently measured.

Examples 1 to 4 and Comparative Examples 1 to 3

The following components were respectively blended to form formulations set forth in Table 1, and kneaded and dispersed using a three-roll mill and a vacuum mortar machine, thereby producing the liquid epoxy resin compositions for sealing of Examples 1 to 4 and Comparative Examples 1 to 3. The unit of the blending in the table is "part(s) by mass", and a blank represents that a corresponding component is not included. The results of the tests conducted on the various characteristics and reliability of the produced liquid epoxy resin compositions for sealing are shown in Table 2.

Epoxy resin 1: bifunctional liquid epoxy resin having an epoxy equivalent of 160 (trade name "YDF-8170C", available from Japan Epoxy Resins Co., Ltd.), obtained by epoxidation of bisphenol F Epoxy resin 2: trifunctional liquid epoxy resin having an epoxy equivalent of 95 (trade name "JER630", available from Japan Epoxy Resins Co., Ltd.), obtained by epoxidation of aminophenol Curing agent 1: diethyltoluenediamine having an active hydrogen equivalent of 45 (trade name "EPICURE W", available from ADEKA Corporation)

Curing agent 2: 4,4'-diamino-3,3'-diethyldiphenylmethane having an active hydrogen equivalent of 63 (trade name "KAYAHARD A-A", available from Nippon Kayaku Co., Ltd.)

Curing accelerator: 2-phenyl-4-methyl-5-hydroxymethyl-imidazole (trade name "2E4MZ", available from SHIKOKU CHEMICALS CORPORATION)

Coupling agent: γ-glycidoxypropyltrimethoxysilane (trade name "KBM-403", available from Shin-Etsu Chemical Co., Ltd.)

Coloring agent: carbon black (trade name "MA-100", available from Mitsubishi Chemical Corporation)

Ion trap agent: bismuth-based ion trap agent (trade name "IXE-500", available from Toagosei Co., Ltd.)

Inorganic filler: spherical fused silica having an average particle diameter of from 1.4 μm to 1.7 μm (trade name "SE-5050", available from Admatechs Company Limited)

Core-shell particle 1:
Core-shell particle in which a core includes a cross-linked polysiloxane, a shell is formed from a polymer of only methyl methacrylate, and the content of the cross-linked polysiloxane is 68% by mass with respect to the total mass of the core and the shell, and which has an average primary particle diameter of 91 μm Core-shell particle 2:
Core-shell particle in which a core includes a cross-linked polysiloxane, a shell is formed from a polymer of glycidyl methacrylate (10% by mass) and methyl methacrylate (90% by mass), and the content of the cross-linked polysiloxane is 68% by mass with respect to the total mass of the core and the shell, and which has an average primary particle diameter of 99 μm Core-shell particle 3:
Core-shell particle in which a core includes a cross-linked polysiloxane, a shell is formed from a polymer of glycidyl methacrylate (20% by mass) and methyl methacrylate (80% by mass), and the content of the cross-linked polysiloxane is 68% by mass with respect to the total mass of the core and the shell, and which has an average primary particle diameter of 99 μm Core-shell particle 4:
Core-shell particle in which a core includes a cross-linked polysiloxane, a shell is formed from a polymer of glycidyl methacrylate (25% by mass) and methyl methacrylate (75% by mass), and the content of the cross-linked polysiloxane is 68% by mass with respect to the total mass of the core and the shell, and which has an average primary particle diameter of 100 μm Core-shell particle 5:
Core-shell particle in which a core includes a cross-linked polysiloxane, a shell is formed from a polymer of glycidyl methacrylate (30% by mass) and methyl methacrylate (70% by mass), and the content of the cross-linked polysiloxane is 68% by mass with respect to the total mass of the core and the shell, and which has an average primary particle diameter of 100 μm Core-shell particle 6:
Core-shell particle in which a core includes a cross-linked polysiloxane, a shell is formed from a polymer of hydroxyethyl acrylate (5% by mass) and methyl methacrylate (95% by mass), and the content of the cross-linked polysiloxane is 68% by mass with respect to the total mass of the core and the shell, and which has an average primary particle diameter of 86 μm Core-shell particle 7:
Core-shell particle in which a core includes a cross-linked polysiloxane, a shell is formed from a polymer of acrylic acid (2% by mass) and methyl methacrylate (98% by mass), and the content of the cross-linked polysiloxane is 68% by mass with respect to the total mass of the core and the shell, and which has an average primary particle diameter of 85 μm

TABLE 1

| Items | Examples | | | | Comparative Examples | | |
|---|---|---|---|---|---|---|---|
| | 1 | 2 | 3 | 4 | 1 | 2 | 3 |
| Epoxy resin 1 | 50 | 50 | 50 | 50 | 50 | 50 | 50 |
| Epoxy resin 2 | 50 | 50 | 50 | 50 | 50 | 50 | 50 |
| Curing agent 1 | 24.9 | 24.9 | 24.9 | 24.9 | 24.9 | 24.9 | 24.9 |
| Curing agent 2 | 17.9 | 17.9 | 17.9 | 17.9 | 17.9 | 17.9 | 17.9 |
| Core-shell particle 1 | | | | | 5 | | |
| Core-shell particle 2 | 5 | | | | | | |
| Core-shell particle 3 | | 5 | | | | | |
| Core-shell particle 4 | | | 5 | | | | |
| Core-shell particle 5 | | | | 5 | | | |
| Core-shell particle 6 | | | | | | 5 | |
| Core-shell particle 7 | | | | | | | 5 |
| Curing accelerator | 1 | 1 | 1 | 1 | 1 | 1 | 1 |
| Silane coupling agent | 1 | 1 | 1 | 1 | 1 | 1 | 1 |
| Coloring agent | 0.8 | 0.8 | 0.8 | 0.8 | 0.8 | 0.8 | 0.8 |
| Ion trap agent | 3 | 3 | 3 | 3 | 3 | 3 | 3 |
| Inorganic filler | 234 | 234 | 234 | 234 | 234 | 234 | 234 |
| Content of core-shell particle (% by mass) | 1.3 | 1.3 | 1.3 | 1.3 | 1.3 | 1.3 | 1.3 |
| Content of inorganic filler (% by mass) | 60 | 60 | 60 | 60 | 60 | 60 | 60 |

TABLE 2

| Items | | | Examples | | | | Comparative Examples | | |
|---|---|---|---|---|---|---|---|---|---|
| | | | 1 | 2 | 3 | 4 | 1 | 2 | 3 |
| Viscosity at 110° C. | Initial value | Pa·S | 0.071 | 0.074 | 0.073 | 0.073 | 0.080 | 0.077 | 0.077 |
| | After 8 hours | | 0.140 | 0.142 | 0.141 | 0.140 | 0.139 | 0.208 | 0.260 |
| Adhesive strength to copper substrate | Initial value | Kgf/7 mm$^2$ | 5.3 | 7.4 | 5.2 | 3.4 | 5.6 | 4.7 | 5.5 |
| | After moisture absorption | | 3.7 | 4.8 | 2.5 | 2.4 | 3.1 | 2.8 | 2.9 |
| Adhesive strength to silicon substrate | Initial value | | 12.9 | 10.7 | 15.1 | 15.1 | 6.1 | 10.4 | 10.1 |
| | After moisture absorption | | 0.9 | 1.8 | 4.9 | 2.6 | 1.0 | 1.9 | 2.3 |
| Fracture toughness | | MPam$^{0.5}$ | 2.7 | 3.1 | 3.1 | 3.0 | 2.5 | 2.9 | 2.8 |

As shown in the results in Table 2, each of the liquid epoxy resin compositions for sealing of Examples 1 to 4 had a lower viscosity at 110° C., a favorable pot life property, superior adhesiveness, and superior fracture toughness. This can be considered to be because the affinity at the interface between the epoxy resin and the particle having a core-shell structure was increased by the introduction of an epoxy group having a high affinity with respect to the epoxy resin included in the liquid epoxy resin composition for sealing into the polymer forming the shell.

The evaluations of the fracture toughness and adhesiveness to a silicon substrate of the liquid epoxy resin composition for sealing of Comparative Example 1 were lower than those of Examples. This can be considered to be because the shell of the particle having a core-shell structure included no epoxy group, and therefore, the affinity at the interface between the epoxy resin and the particle having a core-shell structure was low.

In each of the liquid epoxy resin compositions for sealing of Comparative Examples 2 and 3, the viscosities at 110° C. after storage at 50° C. for 8 hours were high, and the pot life properties were deteriorated, although improvement in adhesiveness and fracture toughness was seen. This can be considered to be because a hydroxyl or carboxyl group included in the shell reacts with the epoxy resin included in the liquid epoxy resin composition for sealing.

As described above, the liquid epoxy resin composition for sealing according to the invention has a superior pot life, superior adhesiveness, and superior fracture toughness. Therefore, use of the liquid resin composition for sealing enables, for example, an electronic component device having excellent reliability to be obtained.

The entire disclosure of Japanese Patent Application No. 2016-091947 is incorporated herein by reference. All documents, patent applications, and technical standards described in this specification are herein incorporated by reference to the same extent as if each individual document, patent application, or technical standard was specifically and individually indicated to be incorporated by reference.

What is claimed is:

1. A liquid epoxy resin composition for sealing, the composition comprising:
   an epoxy resin comprising one or more of a liquid diglycidyl ether epoxy resin and a liquid glycidyl amine epoxy resin, the content of the epoxy resin being 15% by mass or more, with respect to the total mass of the liquid epoxy resin composition for sealing;
   a curing agent comprising a liquid aromatic amine component, the ratio of the number of active hydrogens in the curing agent to the number of epoxy groups in the epoxy resin being in a range of from 0.5 to 2; and
   a particle having a core-shell structure,
   wherein the particle having a core-shell structure comprises: a core comprising a cross-linked polysiloxane; and a shell comprising a polymer comprising a copolymer of methyl methacrylate and glycidyl methacrylate, a content of glycidyl methacrylate ranging from 20 to 35% by mass of the copolymer; and
   the content of the particle having a core-shell structure ranges from 0.1% by mass to 10% by mass, with respect to the total mass of the liquid epoxy resin composition for sealing.

2. The liquid epoxy resin composition for sealing according to claim 1, wherein a content of the cross-linked polysiloxane is from 50% by mass to 70% by mass with respect to a total mass of the core and the shell of the particle having a core-shell structure.

3. The liquid epoxy resin composition for sealing according to claim 2, further comprising a silane coupling agent.

4. An electronic component device, comprising an element sealed with the liquid epoxy resin composition for sealing according to claim 1.

5. The liquid epoxy resin composition for sealing according to claim 1, wherein the content of the epoxy resin is 20% by mass or more, with respect to the total mass of the liquid epoxy resin composition for sealing.

6. The liquid epoxy resin composition for sealing according to claim 1, wherein the content of the epoxy resin is 25% by mass or more, with respect to the total mass of the liquid epoxy resin composition for sealing.

7. The liquid epoxy resin composition for sealing according to claim 1, wherein the ratio of the number of active hydrogens in the curing agent to the number of epoxy groups in the epoxy resin is in a range of from 0.6 to 1.3.

8. The liquid epoxy resin composition for sealing according to claim 1, wherein the ratio of the number of active hydrogens in the curing agent to the number of epoxy groups in the epoxy resin is in a range of from 0.8 to 1.2.

9. The liquid epoxy resin composition for sealing according to claim 1, wherein the content of the particle having a core-shell structure ranges from 0.1% by mass to 7.5% by mass, with respect to the total mass of the liquid epoxy resin composition for sealing.

10. The liquid epoxy resin composition for sealing according to claim 1, wherein the liquid aromatic amine component comprises one or more of diethyltoluenediamine, 1-methyl-3,5-diethyl-2,4-diaminobenzene, 1-methyl-3,5-diethyl-2,6-diaminobenzene, 1,3,5-triethyl-2,6-diaminobenzene, 3,3'-diethyl-4,4'-diaminodiphenylmethane, and 3,5,3',5'-tetramethyl-4,4'-diaminodiphenylmethane.

11. The liquid epoxy resin composition for sealing according to claim 10, wherein a content of the cross-linked polysiloxane is from 50% by mass to 70% by mass with respect to a total mass of the core and the shell of the particle having a core-shell structure.

12. The liquid epoxy resin composition for sealing according to claim 11, further comprising a silane coupling agent.

13. The liquid epoxy resin composition for sealing according to claim 10, wherein the content of the epoxy resin is 20% by mass or more, with respect to the total mass of the liquid epoxy resin composition for sealing.

14. The liquid epoxy resin composition for sealing according to claim 10, wherein the content of the epoxy resin is 25% by mass or more, with respect to the total mass of the liquid epoxy resin composition for sealing.

15. The liquid epoxy resin composition for sealing according to claim 10, wherein the content of the particle having a core-shell structure ranges from 0.1% by mass to 7.5% by mass, with respect to the total mass of the liquid epoxy resin composition for sealing.

* * * * *